(12) United States Patent
Huang et al.

(10) Patent No.: US 8,669,803 B2
(45) Date of Patent: Mar. 11, 2014

(54) HIGH SPEED LEVEL SHIFTER FOR CONVERTING LOW INPUT VOLTAGE INTO WIDE-RANGE HIGH OUTPUT VOLTAGE

(71) Applicants: Global Unichip Corporation, Hsinchu (TW); Taiwan Semiconductor Manufacturing Co., Ltd., Hsin-Chu (TW)

(72) Inventors: Chao-Yen Huang, Taipei (TW); Jung-Tsun Chuang, Tainan (TW)

(73) Assignees: Global Unichip Corporation, Hsinchu (TW); Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/772,447

(22) Filed: Feb. 21, 2013

(65) Prior Publication Data

US 2013/0214838 A1      Aug. 22, 2013

(30) Foreign Application Priority Data

Feb. 21, 2012   (TW) .............................. 101105697 A

(51) Int. Cl.
   *H03L 5/00*        (2006.01)

(52) U.S. Cl.
   USPC ........... 327/333; 326/68; 326/81; 365/189.11

(58) Field of Classification Search
   USPC .................... 327/333; 326/62, 63, 68, 80, 81; 365/189.11
   See application file for complete search history.

(56) References Cited

U.S. PATENT DOCUMENTS

| | | | | |
|---|---|---|---|---|
| 4,450,371 A * | 5/1984 | Bismarck | ........................ | 326/17 |
| 4,532,436 A * | 7/1985 | Bismarck | ...................... | 327/208 |
| 5,444,396 A * | 8/1995 | Soneda | ........................... | 326/81 |
| 6,650,168 B1 | 11/2003 | Wang et al. | | |
| 6,853,234 B2 * | 2/2005 | Bucossi | ........................ | 327/333 |
| 6,888,394 B2 * | 5/2005 | Cleary et al. | .................. | 327/333 |
| 7,902,870 B1 * | 3/2011 | Jiang | ............................... | 326/68 |
| 8,319,540 B2 * | 11/2012 | Barrow | ........................ | 327/333 |
| 8,368,425 B2 * | 2/2013 | Huang | ............................ | 326/81 |

* cited by examiner

*Primary Examiner* — William Hernandez
(74) *Attorney, Agent, or Firm* — WPAT, PC; Justin King

(57) ABSTRACT

A high speed level shifter is provided for converting a low input voltage into a wide-range high output voltage. By utilizing two switching units to improve the latching speed of the latching unit of the level shifter, the duty cycle of the input signal is nearly equal to the duty cycle of the output signal.

24 Claims, 8 Drawing Sheets

HIGH SPEED LEVEL SHIFTER FOR CONVERTING LOW INPUT VOLTAGE INTO WIDE-RANGE HIGH OUTPUT VOLTAGE

This application claims the benefit of Taiwan Patent Application Serial No. 101105697, filed Feb. 21, 2012, the subject matter of which is incorporated herein by reference.

FIELD OF THE INVENTION

The present invention relates to a level shifter, and more particularly to a high speed level shifter for converting a low input voltage into a wide-range high output voltage.

BACKGROUND OF THE INVENTION

Generally, a level shifter is an important component of an interface circuit for receiving a narrow-range input signal and converting the input signal into a wide-range output signal. For increasing the processing speed of an integrated circuit (IC), the integrated circuit is usually equipped with a core circuit. The core circuit has a low core voltage. For outputting the output signal from the core circuit to an external circuit outside the integrated circuit, a level shifter is used as an interface circuit to convert the low core voltage into an input/output voltage.

FIG. 1 is a schematic circuit block diagram illustrating a conventional level shifter. As shown in FIG. 1, the level shifter 100 comprises an input side logic unit 110, a latching unit 120, and an output side buffering unit 130. Basically, the input signal Sin is in the range between a core voltage Vcore and a ground voltage (0V), and the output signal Sout is in the range between an input/output voltage Vio and the ground voltage (0V). In other words, if the input signal Sin is in the low-level state (0V), the output signal Sout is in the low-level state (0V). Whereas, if the input signal Sin is in the high-level state (i.e. Sin=Vcore), the latching unit 120 performs a voltage level conversion, so that the output signal Sout is in the high-level state (i.e. Sout=Vio).

FIG. 2 is a schematic circuit diagram illustrating the detailed circuitry of the conventional level shifter. The input side logic unit 110 comprises an inverter INV1. The inverter INV1 is operated between the core voltage Vcore and the ground voltage (0V). The input terminal of the inverter INV1 receives the input signal Sin. Since all components of the input side logic unit 110 are operated between the core voltage Vcore and the ground voltage (0V), the components of the input side logic unit 110 may be implemented by thin-oxide devices.

The latching unit 120 comprises transistors P1, P2, N1, and N2. The transistors N1 and N2 are collaboratively defined as a load unit 126. The source terminal of the transistor P1 is connected to the input/output voltage Vio. The drain terminal of the transistor P1 is connected to a node a1. The gate terminal of the transistor P1 is connected to a node a2. The source terminal of the transistor P2 is connected to the input/output voltage Vio. The drain terminal of the transistor P2 is connected to the node a2. The gate terminal of the transistor P2 is connected to the node a1. The source terminal of the transistor N1 is connected to a ground terminal GND. The drain terminal of the transistor N1 is connected to the node a1. The gate terminal of the transistor N1 is connected to the output terminal of the inverter INV1. The source terminal of the transistor N2 is connected to the ground terminal GND. The drain terminal of the transistor N2 is connected to the node a2. The gate terminal of the transistor N2 receives the input signal Sin. Since all components of the latching unit 120 are operated between the input/output voltage Vio and the ground voltage (0V), the components of the latching unit 120 are all implemented by thick-oxide devices.

The output side buffering unit 130 comprises an inverter INV2. The inverter INV2 is operated between the input/output voltage Vio and the ground voltage (0V). The input terminal of the inverter INV2 is connected to the node a2. The output terminal of the inverter INV2 generates the output signal Sout. Similarly, since all components of the output side buffering unit 130 are operated between the input/output voltage Vio and the ground voltage (0V), the components of the output side buffering unit 130 are implemented by thick-oxide devices.

The operating principles of the conventional level shifter 100 will be illustrated as follows. It is assumed that the core voltage Vcore is a first high voltage level, the input/output voltage Vio is a second high voltage level, and the ground voltage is a low voltage level. If the input signal Sin has the first high voltage level, the output terminal of the inverter INV1 has the low voltage level. Meanwhile, the transistor N2 is turned on, the transistor N1 is turned off, the transistor P1 is turned on, and the transistor P2 is turned off. Consequently, the node a1 generates the second high voltage level, and the node a2 generates the low voltage level. Under this circumstance, the output signal Sout from the output terminal of the inverter INV2 has the second high voltage level.

Whereas, if the input signal Sin has the low voltage level, the output terminal of the inverter INV1 has the first high voltage level. Meanwhile, the transistor N1 is turned on, the transistor N2 is turned off, the transistor P2 is turned on, and the transistor P1 is turned off. Consequently, the node a1 generates the low voltage level, and the node a2 generates the second high voltage level. Under this circumstance, the output signal Sout from the output terminal of the inverter INV2 has the low voltage level.

Since the magnitude of the input/output voltage Vio may influence the strength of turning on/off the transistors P1 and P2, the latching speed of the latching unit 120 is also affected by the magnitude of the input/output voltage Vio. Consequently, for designing the conventional level shifter, the magnitudes of the core voltage Vcore and the input/output voltage Vio should be firstly realized, and then the size of the transistor is properly adjusted according to the magnitudes of the core voltage Vcore and the input/output voltage Vio. In such way, the level shifter can be used in a specified application.

For example, if the core voltage Vcore is 1.2V, the input/output voltage Vio is 1.8V and the input signal Sin is a clock signal with a duty cycle of 50%, the processing speed is 400 Mbps. By properly adjusting the size of the transistor, the level shifter 100 of FIG. 2 can generate the output signal Sout with a duty cycle of 50%. However, if the input/output voltage Vio of the level shifter 100 is changed to 3.3V but the other conditions are kept unchanged, since the strength of turning on/off the transistors P1 and P2 is changed, the duty cycle of the output signal Sout is changed to about 40%.

On the other hand, if the core voltage Vcore is 1.2V, the input/output voltage Vio is 3.3V and the input signal Sin is a clock signal with a duty cycle of 50%, the processing speed is 400 Mbps. By properly adjusting the size of the transistor, the level shifter 100 of FIG. 2 can generate the output signal Sout with a duty cycle of 50%. However, if the input/output voltage Vio of the level shifter 100 is changed to 1.8V but the other conditions are kept unchanged, since the strength of turning on/off the transistors P1 and P2 is changed, the duty cycle of the output signal Sout is changed to about 60%.

From the above discussions, if the input/output voltage Vio of the level shifter 100 is changed, the duty cycle of the output signal Sout is correspondingly changed. In other words, the conventional level shifter 100 fails to generate the wide-range high output voltage.

In this context, the level shifter for generating the wide-range high output voltage is a level shifter for generating an output signal Sout with the nearly unchanged duty cycle when the input/output voltage Vio is changed.

Moreover, in the double data rate (DDR) memory field and the open NAND flash interface (ONFI) field, the duty cycle of the clock signal is one of the important factors. Generally, the allowable duty cycle of the clock signal is in the range between 48% and 52%. If the duty cycle of the clock signal exceeds this allowable range, the operations of the DDR memory or the flash memory become abnormal.

Therefore, there is a need of providing a level shifter for generating an output signal Sout with the same duty cycle as the input signal Sin when the input/output voltage Vio is changed within a wide range between 1.5V and 3.3V.

SUMMARY OF THE INVENTION

An embodiment of the present invention provides a level shifter. The level shifter includes an input side logic unit, a latching unit, and an output side buffering unit. The input side logic unit is used for receiving an input signal and generating a complementary input signal pair, wherein the input signal and the complementary input signal pair are operated between a core voltage and a ground voltage. The latching unit includes a first P-type transistor, a second P-type transistor, and a load unit. The first P-type transistor has a source terminal receiving an input/output voltage, a drain terminal connected to a first node, and a gate terminal connected to a second node. The second P-type transistor has a source terminal receiving the input/output voltage, a drain terminal connected to the second node, and a gate terminal connected to the first node. The load unit is connected to the first node and the second node. The first node and the second node generate a complementary output signal pair according to the complementary input signal pair. The output side buffering unit is connected to the second node for generating the complementary output signal pair, so that the complementary output signal pair is operated between the input/output voltage and the ground voltage. The latching unit further includes a first switching unit and a second switching unit. The first switching unit includes a first switch element and a second switch element, and the second switching unit includes a third switch element and a fourth switch element. The first switch element and the second switch element are serially connected between the input/output voltage and the first node, the first switch element has a control terminal receiving one signal of the complementary output signal pair. The second switch element has a control terminal receiving one signal of the complementary input signal pair. The third switch element and the fourth switch element are serially connected between the input/output voltage and the second node. The third switch element has a control terminal receiving the other signal of the complementary output signal pair. The fourth switch element has a control terminal receiving the other signal of the complementary input signal pair.

Another embodiment of the present invention provides a level shifter. The level shifter includes an input side logic unit, a latching unit, a duty-cycle correction circuit, and an output side buffering unit. The input side logic unit for is receiving an input signal and generating a complementary input signal pair, wherein the input signal and the complementary input signal pair are operated between a core voltage and a ground voltage. The latching unit includes a first P-type transistor, a second P-type transistor, and a load unit. The first P-type transistor has a source terminal receiving an input/output voltage, a drain terminal connected to a first node, and a gate terminal connected to a second node. The second P-type transistor has a source terminal receiving the input/output voltage, a drain terminal connected to the second node, and a gate terminal connected to the first node. The load unit is connected to the first node and the second node. The first node and the second node generate a first signal and an inverted first signal according to the complementary input signal pair. The duty-cycle correction circuit is connected to the first node and the second node. If a level switching action of the first signal is faster than a level switching action of the inverted first signal, the duty-cycle correction circuit generates an inverted output signal in response to the first signal. Whereas, if the level switching action of the inverted first signal is faster than the level switching action of the first signal, the duty-cycle correction circuit generates the inverted output signal in response to the inverted first signal. The output side buffering unit is used for receiving the inverted output signal and generating the complementary output signal pair according to the inverted output signal, so that the complementary output signal pair is operated between the input/output voltage and the ground voltage. The latching unit further includes a first switching unit and a second switching unit. The first switching unit includes a first switch element and a second switch element, and the second switching unit includes a third switch element and a fourth switch element. The first switch element and the second switch element are serially connected between the input/output voltage and the first node. The first switch element has a control terminal receiving the first signal. The second switch element has a control terminal receiving one signal of the complementary input signal pair. The third switch element and the fourth switch element are serially connected between the input/output voltage and the second node. The third switch element has a control terminal receiving the inverted first signal. The fourth switch element has a control terminal receiving the other signal of the complementary input signal pair.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 3:
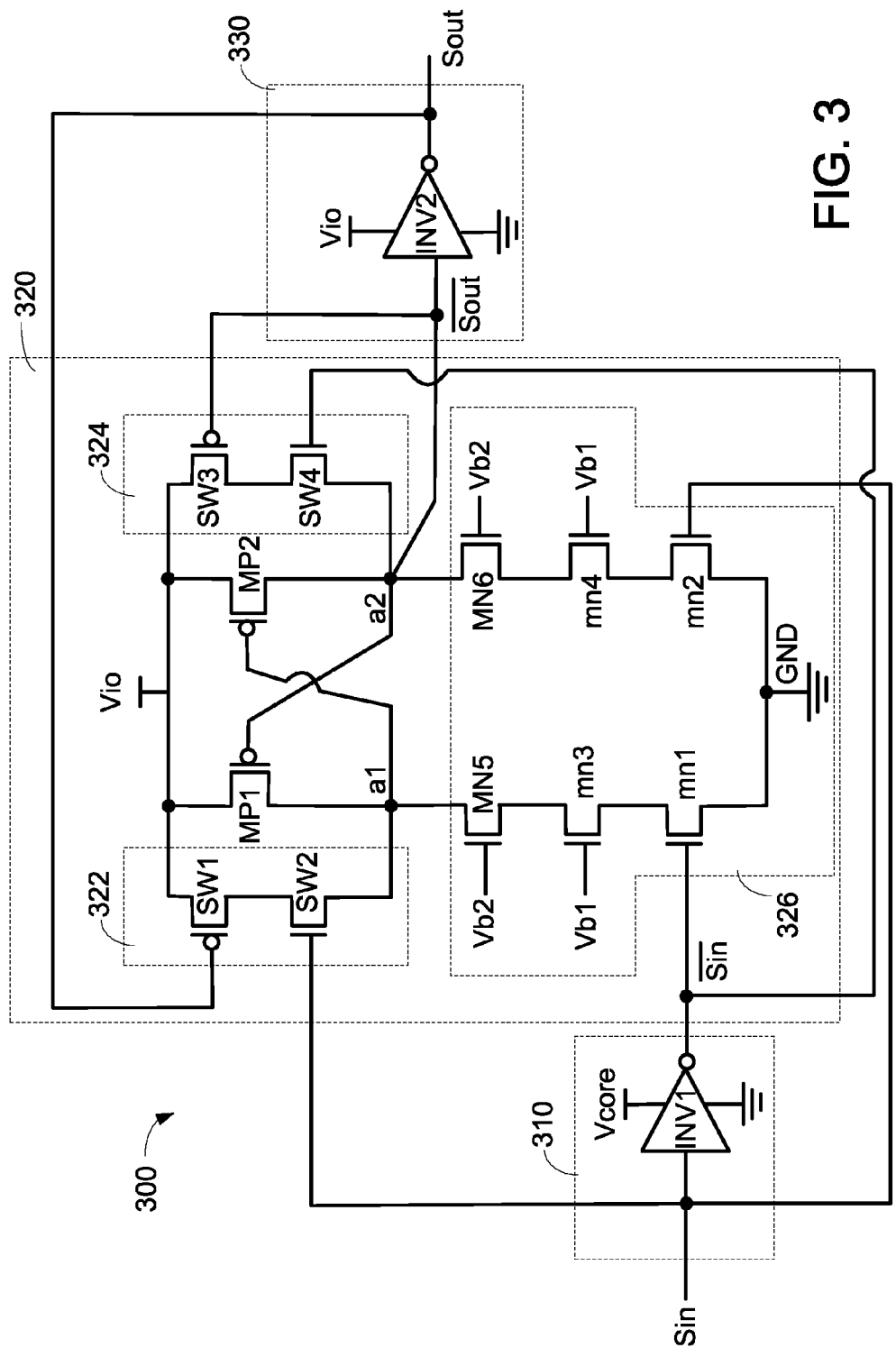
FIG. 3 is a schematic circuit diagram illustrating the detailed circuitry of a level shifter according to an embodiment of the present invention.

FIG. 3 is a schematic circuit diagram illustrating the detailed circuitry of a level shifter according to an embodiment of the present invention. As shown in FIG. 3, the level shifter 300 comprises an input side logic unit 310, a latching unit 320, and an output side buffering unit 330. Moreover, the input signal Sin is in the range between a core voltage Vcore and a ground voltage (0V), and the output signal Sout is in the range between an input/output voltage Vio and the ground voltage (0V).

The input side logic unit 310 comprises a first inverter INV1. The first inverter INV1 is operated between the core voltage Vcore and the ground voltage (0V). The input terminal of the first inverter INV1 receives the input signal Sin. The output terminal of the first inverter INV1 generates an inverted input signal $\overline{Sin}$. Since all components of the input side logic unit 310 are operated between the core voltage Vcore and the ground voltage (0V), the components of the input side logic unit 310 are all implemented by thin-oxide devices.

The output side buffering unit 330 comprises a second inverter INV2. The second inverter INV2 is operated between the input/output voltage Vio and the ground voltage (0V). The input terminal of the second inverter INV2 is connected to the node a2 for receiving an inverted output signal $\overline{Sout}$. The output terminal of the second inverter INV2 generates the output signal Sout. Similarly, since all components of the output side buffering unit 330 are operated between the input/output voltage Vio and the ground voltage (0V), the components of the output side buffering unit 330 are all implemented by thick-oxide devices.

The latching unit 320 comprises a first P-type transistor MP1, a second P-type transistor MP2, a load unit 326, a first switching unit 322, and a second switching unit 324. Moreover, in the drawings, the transistors of the latching unit 320 designated by big letters are thick-oxide devices; and the transistors of the latching unit 320 designated by small letters are thin-oxide devices.

The source terminal of the first P-type transistor MP1 is connected to the input/output voltage Vio. The drain terminal of the first P-type transistor MP1 is connected to the node a1. The gate terminal of the first P-type transistor MP1 is connected to the node a2. The source terminal of the second P-type transistor MP2 is connected to the input/output voltage Vio. The drain terminal of the second P-type transistor MP2 is connected to the node a2. The gate terminal of the second P-type transistor MP2 is connected to the node a1.

The load unit 326 comprises a first N-type transistor mn1, a second N-type transistor mn2, a third N-type transistor mn3, a fourth N-type transistor mn4, a fifth N-type transistor MN5, and a sixth N-type transistor MN6. The source terminal of the first N-type transistor mn1 is connected to a ground terminal GND. The gate terminal of the first N-type transistor mn1 receives the inverted input signal $\overline{Sin}$. The source terminal of the second N-type transistor mn2 is connected to the ground terminal GND. The gate terminal of the second N-type transistor mn2 receives the input signal Sin. The source terminal of the third N-type transistor mn3 is connected to the drain terminal of the first N-type transistor mn1. The gate terminal of the third N-type transistor mn3 receives a first bias voltage Vb1. The source terminal of the fourth N-type transistor mn4 is connected to the drain terminal of the second N-type transistor mn2. The gate terminal of the fourth N-type transistor mn4 receives the first bias voltage Vb1. The source terminal of the fifth N-type transistor MN5 is connected to the drain terminal of the third N-type transistor mn3. The gate terminal of the fifth N-type transistor MN5 receives a second bias voltage Vb2. The drain terminal of the fifth N-type transistor MN5 is connected to the node a1. The source terminal of the sixth N-type transistor MN6 is connected to the drain terminal of the fourth N-type transistor mn4. The gate terminal of the sixth N-type transistor MN6 receives the second bias voltage Vb2. The drain terminal of the sixth N-type transistor MN6 is connected to the node a2.

The first switching unit 322 comprises a first switch element SW1 and a second switch element SW2. The first switch element SW1 and the second switch element SW2 are serially connected between the input/output voltage Vio and the node a1. The control terminal of the first switch element SW1 receives the output signal Sout. The control terminal of the second switch element SW2 receives the input signal Sin. The second switching unit 324 comprises a third switch element SW3 and a fourth switch element SW4. The third switch element SW3 and the fourth switch element SW4 are serially connected between the input/output voltage Vio and the node a2. The control terminal of the third switch element SW3 receives the inverted output signal $\overline{Sout}$. The control terminal of the fourth switch element SW4 receives the inverted input signal $\overline{Sin}$. In this embodiment, the first switch element SW1 and the third switch element SW3 are P-type transistors, and the second switch element SW2 and the fourth switch element SW4 are N-type transistors.

Since the first N-type transistor mn1 and the second N-type transistor mn2 of the load unit 326 are thin-oxide devices, the speed of turning on/off the first N-type transistor mn1 and the second N-type transistor mn2 is very fast. However, the first N-type transistor mn1 and the second N-type transistor mn2 fail to withstand high voltage stress. For reducing the voltage stress of the first N-type transistor mn1 and the second N-type transistor mn2, the third N-type transistor mn3 and the fifth N-type transistor MN5 are serially connected between the node a1 and the first N-type transistor mn1, and the fourth N-type transistor mn4 and the sixth N-type transistor MN6 are serially connected between the node a2 and the second N-type transistor mn2. Generally, by the first bias voltage Vb1, the third N-type transistor mn3 and the fourth N-type transistor mn4 are controlled to be in the normally turned on state. By the second bias voltage Vb2, the fifth N-type transistor MN5 and the sixth N-type transistor MN6 are controlled to be in the normally turned on state. In an embodiment, the first bias voltage Vb1 is equal to the core voltage Vcore, and the second bias voltage Vb2 is equal to the input/output voltage Vio.

In a case that the input signal Sin and the output signal Sout are in the steady state, the first switching unit 322 and the second switching unit 324 are both in the open state. During the level switching process of the input signal Sin and the output signal Sout, one of the first switching unit 322 and the second switching unit 324 is in the open state, and the other one of the first switching unit 322 and the second switching unit 324 is in the close state. Through the switching unit in the close state, the input/output voltage Vio can be quickly provided to the node a1 or a2. Consequently, the latching speed of the latching unit 320 will be enhanced. Under this circumstance, the duty cycle of the output signal Sout is close to the duty cycle of the input signal Sin.

Figure 4A:
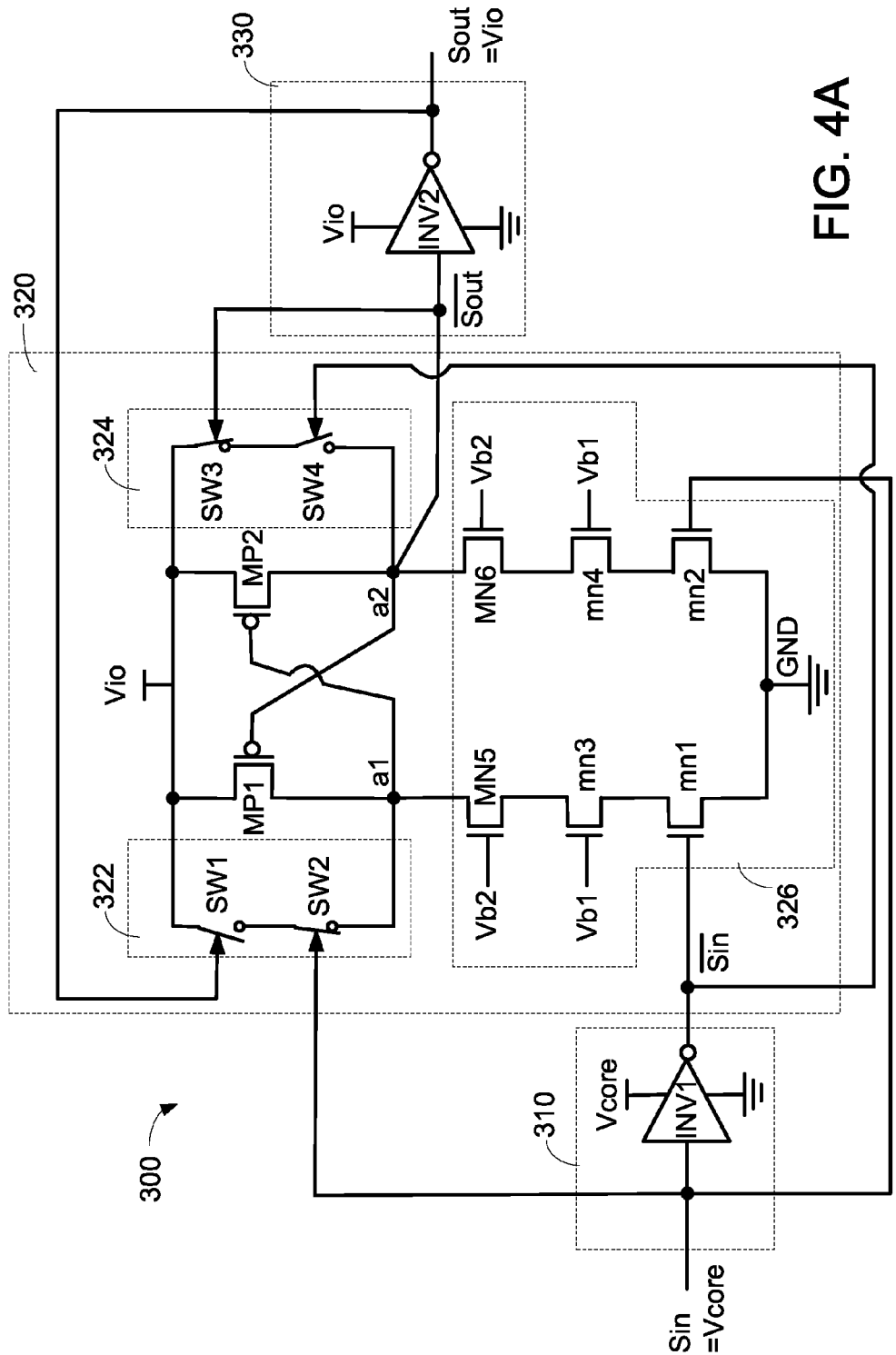
FIGS. 4A~4D schematically illustrate the actions of the level shifter in four different states.
Figure 4B:
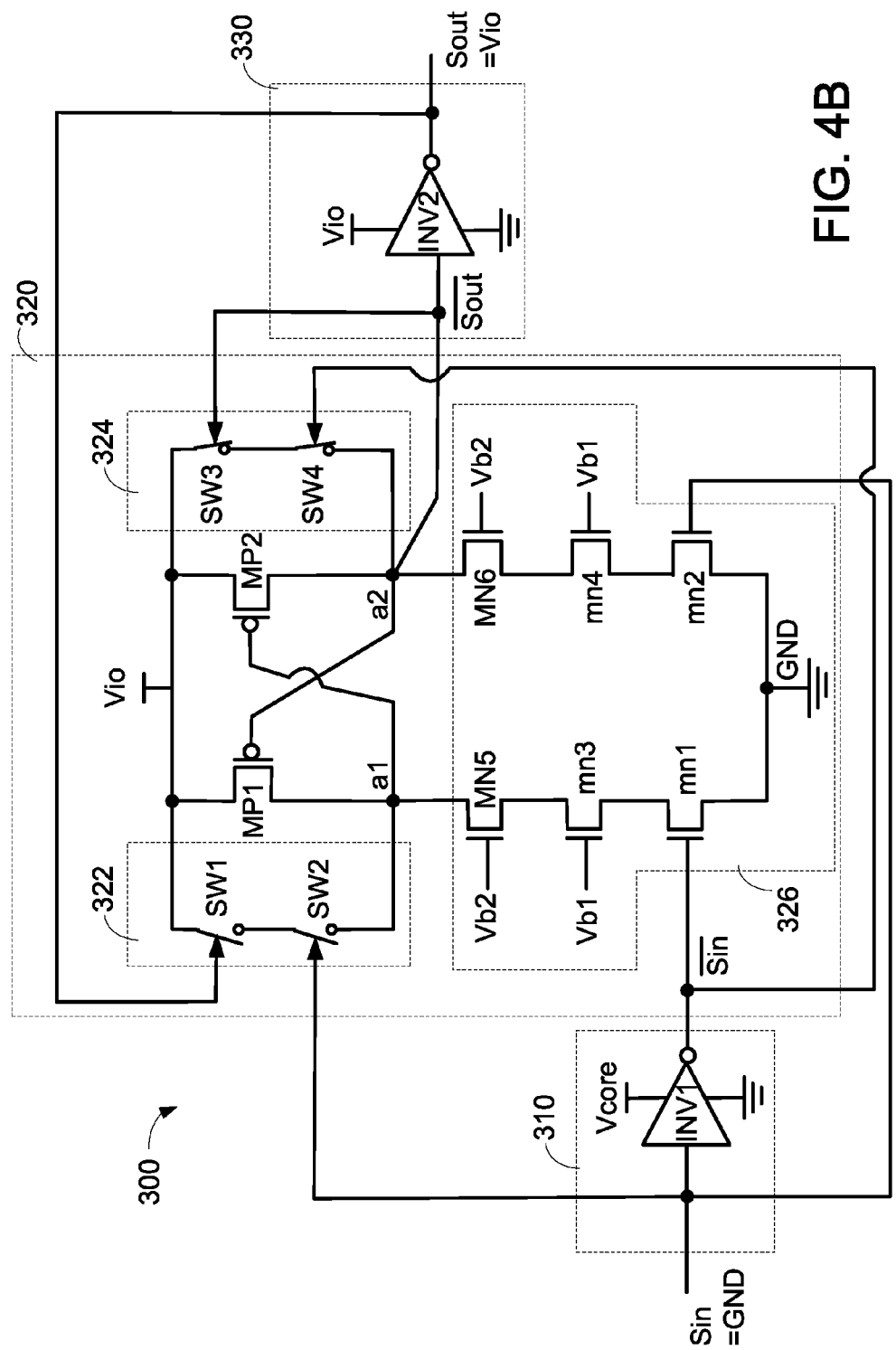
Figure 4C:
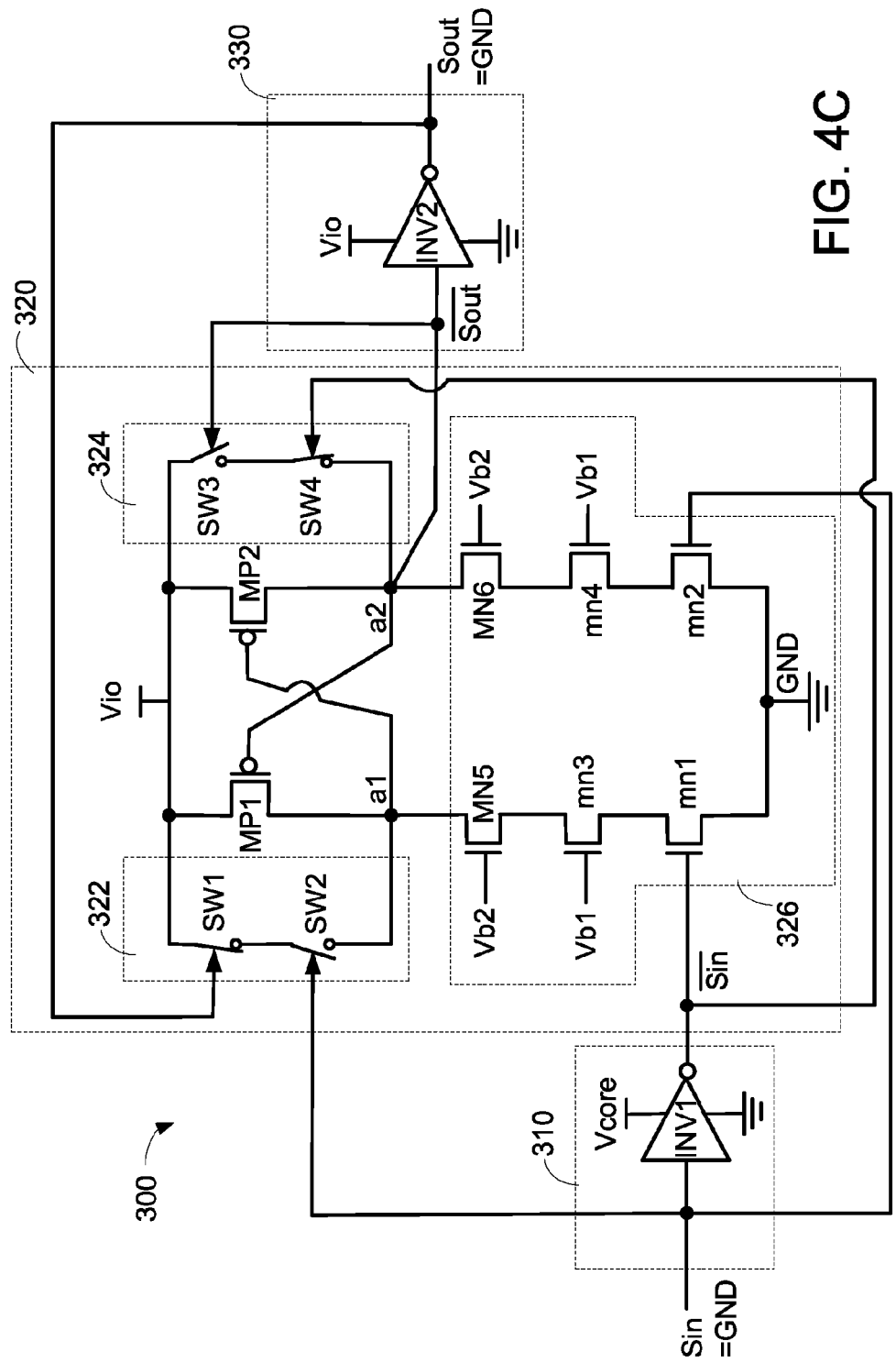
Figure 4D:
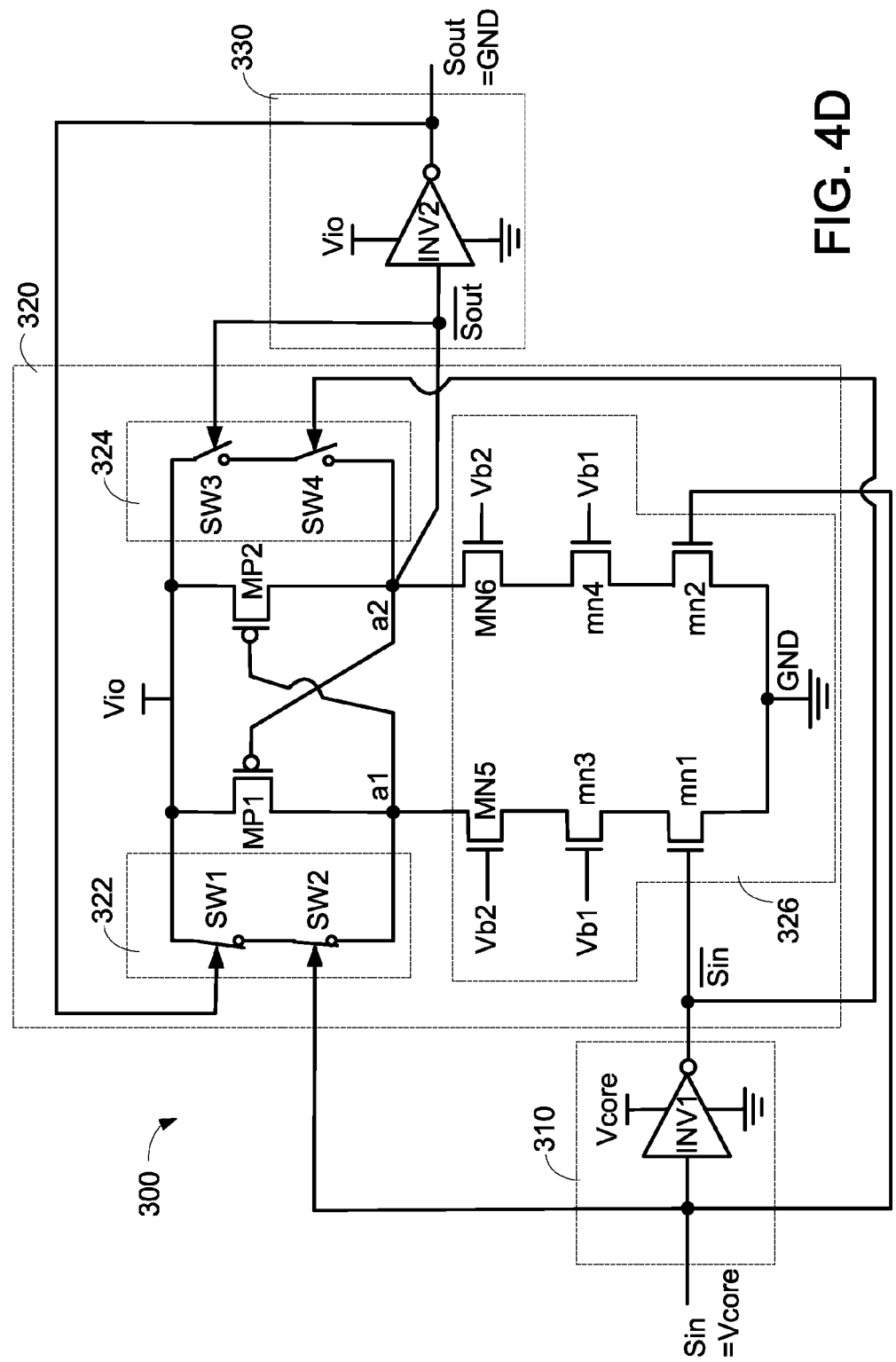

The operating principles of the level shifter 300 will be illustrated as follows. It is assumed that the core voltage Vcore is a first high voltage level, the input/output voltage Vio is a second high voltage level, and the ground voltage is a low voltage level. FIGS. 4A~4D schematically illustrate the actions of the level shifter 300 in four different states. As shown in FIG. 4A, the input signal Sin is in a steady state period of maintaining at a first high voltage level. As shown in FIG. 4B, the input signal Sin is in a transient state period of switching from the first high voltage level to a low voltage level. As shown in FIG. 4C, the input signal Sin is in a steady state period of maintaining at the low voltage level. As shown in FIG. 4D, the input signal Sin is in a transient state period of switching from the low voltage level to the first high voltage level.

Please refer to FIG. 4A. Since the input signal Sin has the first high voltage level, the inverted input signal $\overline{Sin}$ has the low voltage level. Meanwhile, the second N-type transistor mn2 is turned on, the first N-type transistor mn1 is turned off, the first P-type transistor MP1 is turned on, and the second P-type transistor MP2 is turned off. Consequently, the node a1 generates the second high voltage level, and the node a2 generates the low voltage level. Under this circumstance, the inverted output signal $\overline{Sout}$ has the low voltage level, and the output signal Sout has the second high voltage level. Obviously, since the first switch element SW1 of the first switching unit 322 is in the open state and the second switch element SW2 is in the close state, the first switching unit 322 is in the open state. Similarly, since the third switch element SW3 of the second switching unit 324 is in the close state and the fourth switch element SW4 is in the open state, the second switching unit 324 is also in the open state. From the above discussions, during the steady state period of maintaining the input signal Sin at the first high voltage level and maintaining the output signal at the second high voltage level, the first switching unit 322 and the second switching unit 324 do not generate any leakage current.

Please refer to FIG. 4B. During transient state period of switching the input signal Sin from the first high voltage level to the low voltage level, the inverted input signal $\overline{Sin}$ suddenly has the first high voltage level, the output signal Sout is still maintained at the second high voltage level (Vio), and the inverted output signal $\overline{Sout}$ is still maintained at the low voltage level. Meanwhile, the first N-type transistor mn1 is turned on, the second N-type transistor mn2 is turned off, the second P-type transistor MP2 is turned on, and the first P-type transistor MP1 is turned off. Since the third switch element SW3 and the fourth switch element SW4 of the second switching unit 324 are both in the close state, the second switching unit 324 is in the close state, and the voltage at the node a2 is quickly pulled up to the second high voltage level (Vio). At the same time, since the first switch element SW1 and the second switch element SW2 of the first switching unit 322 are both in the open state, the first switching unit 322 is in the open state. Moreover, since the first N-type transistor mn1 is turned on, the voltage at the node a1 is quickly pulled down to the low voltage level.

Please refer to FIG. 4C. Since the node a2 generates the second high voltage level and the node a1 generates the low voltage level, the inverted output signal $\overline{Sout}$ is switched to the second high voltage level, and the output signal Sout is switched to the low voltage level. Obviously, since the first switch element SW1 of the first switching unit 322 is in the close state and the second switch element SW2 is in the open state, the first switching unit 322 is in the open state. Similarly, since the third switch element SW3 of the second switching unit 324 is in the open state and the fourth switch element SW4 is in the close state, the second switching unit 324 is also in the open state. From the above discussions, during the steady state period of maintaining the input signal Sin at the low voltage level and maintaining the output signal at the low voltage level, the first switching unit 322 and the second switching unit 324 do not generate any leakage current.

Please refer to FIG. 4D. During transient state period of switching the input signal Sin to the first high voltage level, the inverted input signal $\overline{Sin}$ suddenly has the low voltage level, the output signal Sout is still maintained at the low voltage level (Vio), and the inverted output signal $\overline{Sout}$ is still maintained at the second high voltage level. Meanwhile, the second N-type transistor mn2 is turned on, the first N-type transistor mn1 is turned off, the first P-type transistor MP1 is turned on, and the second P-type transistor MP2 is turned off. Moreover, since the first switch element SW1 and the second switch element SW2 of the first switching unit 322 are both in the close state, the first switching unit 322 is in the close state, and the voltage at the node a1 is quickly pulled up to the second high voltage level (Vio). At the same time, since the third switch element SW3 and the fourth switch element SW4 of the second switching unit 324 are both in the open state, the second switching unit 324 is in the open state, and the voltage at the node a2 is quickly pulled down to the low voltage level.

After the transient state period of FIG. 4D, the level shifter 300 is operated during the steady state period. In other words, the actions as shown in FIGS. 4A~4D are periodically done, and are not redundantly described herein.

From the above discussions, when the input/output voltage Vio is changed, the strength of turning on/off the first P-type transistor MP1 and the second P-type transistor MP2 will be changed. However, the uses of the switching units in the level shifter of the present invention are helpful to solve these drawbacks. Consequently, the latching speed of the latching unit 320 is not changed with the input/output voltage Vio. Under this circumstance, the duty cycle of the output signal Sout is close to the duty cycle of the input signal Sin.

In an application example of the level shifter of the present invention, the core voltage Vcore is 1.2V, the input signal Sin is a clock signal with a duty cycle of 50%, and the processing speed is 400 Mbps. In a case that the input/output voltage Vio is 1.8V, the duty cycle of the input signal Sin is 49.85%. In a case that the input/output voltage Vio is 3.3V, the duty cycle of the input signal Sin is 50.67%. That is, the level shifter of the present invention is capable of converting a low input voltage into a wide-range high output voltage.

Moreover, in some embodiments, if the core voltage Vcore is 0.9V and the input/output voltage Vio is in the range between 1.5V and 1.8V, the processing speed may be up to 2133 Mbps. In other words, the level shifter of the present invention is a high speed level shifter.

Figure 5A:
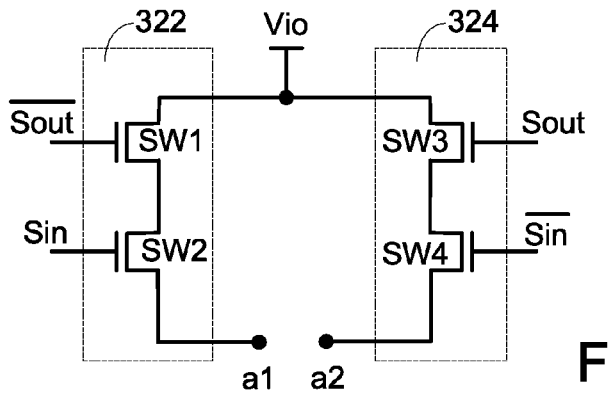
FIGS. 5A~5C are schematic circuit diagrams illustrating three variant examples of the first switching unit and the second switching unit used in the level shifter of the present invention.
Figure 5B:
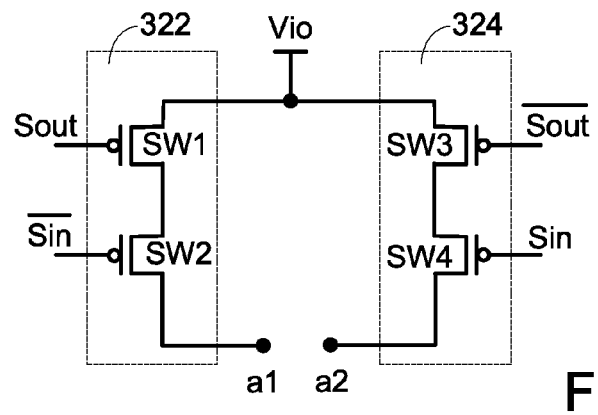
Figure 5C:
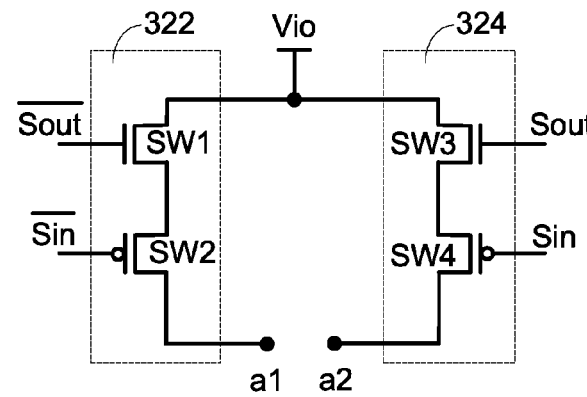

It is noted that numerous modifications and alterations of the first switching unit 322 and the second switching unit 324 of the level shifter of FIG. 3 may be made while retaining the teachings of the invention. FIGS. 5A~5C are schematic circuit diagrams illustrating three variant examples of the first switching unit and the second switching unit used in the level shifter of the present invention.

Please refer to FIG. 5A. The first switching unit 322 comprises a first switch element SW1 and a second switch element SW2. The first switch element SW1 and the second switch element SW2 are serially connected between the input/output voltage Vio and the node a1. The control terminal of the first switch element SW1 receives the inverted output signal $\overline{Sout}$. The control terminal of the second switch element SW2 receives the input signal Sin. The second switching unit 324 comprises a third switch element SW3 and a fourth switch element SW4. The third switch element SW3 and the fourth switch element SW4 are serially connected between the input/output voltage Vio and the node a2. The control terminal of the third switch element SW3 receives the output signal Sout. The control terminal of the fourth switch element SW4 receives the inverted input signal $\overline{Sin}$. In this embodiment, the first switch element SW1, the second switch element SW2, the third switch element SW3 and the fourth switch element SW4 are all N-type transistors.

Please refer to FIG. 5B. The first switching unit 322 comprises a first switch element SW1 and a second switch element SW2. The first switch element SW1 and the second switch element SW2 are serially connected between the input/output voltage Vio and the node a1. The control terminal of the first switch element SW1 receives the output signal Sout. The control terminal of the second switch element SW2 receives the inverted input signal $\overline{Sin}$. The second switching unit 324 comprises a third switch element SW3 and a fourth switch element SW4. The third switch element SW3 and the fourth switch element SW4 are serially connected between the input/output voltage Vio and the node a2. The control terminal of the third switch element SW3 receives the inverted output signal $\overline{Sout}$. The control terminal of the fourth switch element SW4 receives the input signal Sin. In this embodiment, the first switch element SW1, the second switch element SW2, the third switch element SW3 and the fourth switch element SW4 are all P-type transistors.

Please refer to FIG. 5C. The first switching unit 322 comprises a first switch element SW1 and a second switch element SW2. The first switch element SW1 and the second switch element SW2 are serially connected between the input/output voltage Vio and the node a1. The control terminal of the first switch element SW1 receives the inverted output signal $\overline{Sout}$. The control terminal of the second switch element SW2 receives the inverted input signal $\overline{Sin}$. The second switching unit 324 comprises a third switch element SW3 and a fourth switch element SW4. The third switch element SW3 and the fourth switch element SW4 are serially connected between the input/output voltage Vio and the node a2. The control terminal of the third switch element SW3 receives the output signal Sout. The control terminal of the fourth switch element SW4 receives the input signal Sin. In this embodiment, the first switch element SW1 and the third switch element SW3 are N-type transistors, and the second switch element SW2 and the fourth switch element SW4 are P-type transistors.

From the above description, the input signal Sin and the inverted input signal $\overline{Sin}$ constitute a complementary input signal pair, and the output signal Sout and the inverted output signal $\overline{Sout}$ constitute a complementary output signal pair. The control terminal of the first switch element SW1 receives one signal of the complementary output signal pair. The control terminal of the third switch element SW3 receives the other signal of the complementary output signal pair. The control terminal of the second switch element SW2 receives one signal of the complementary input signal pair. The control terminal of the fourth switch element SW4 receives the other signal of the complementary input signal pair.

Figure 1:
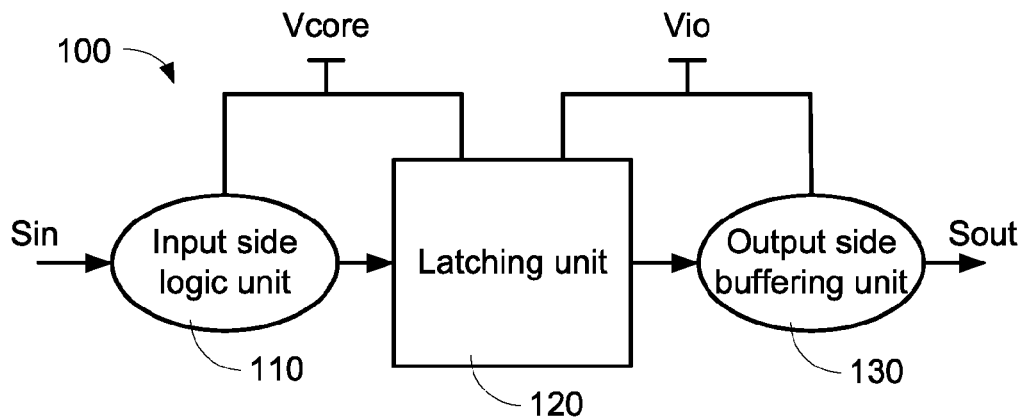
FIG. 1 (prior art) is a schematic circuit block diagram illustrating a conventional level shifter.
Figure 2:
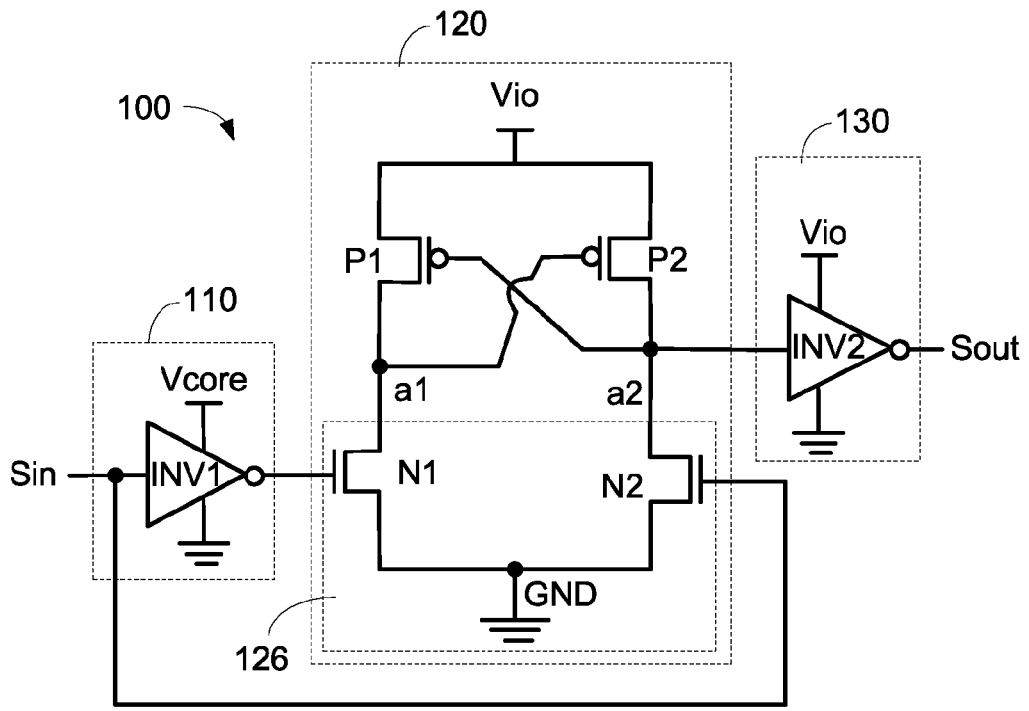
FIG. 2 (prior art) is a schematic circuit diagram illustrating the detailed circuitry of the conventional level shifter.

Moreover, the serially-connected transistors of the load unit 326 of the level shifter of the present invention are used for reducing the voltage stress. It is noted that the number of the serially-connected transistors of the load unit 326 may be varied according to the practical requirements. Of course, those skilled in the art will readily observe that the two N-type transistors (e.g. thick-oxide devices) of the load unit 126 as shown in FIG. 2 may be applied to the level shifter of the present invention.

Moreover, for providing a more correct duty cycle of the output signal Sout, the level shifter of the present invention may be additionally equipped with a duty-cycle correction circuit. The N-type transistors and the P-type transistors of the duty-cycle correction circuit are thick-oxide devices.

Figure 6:
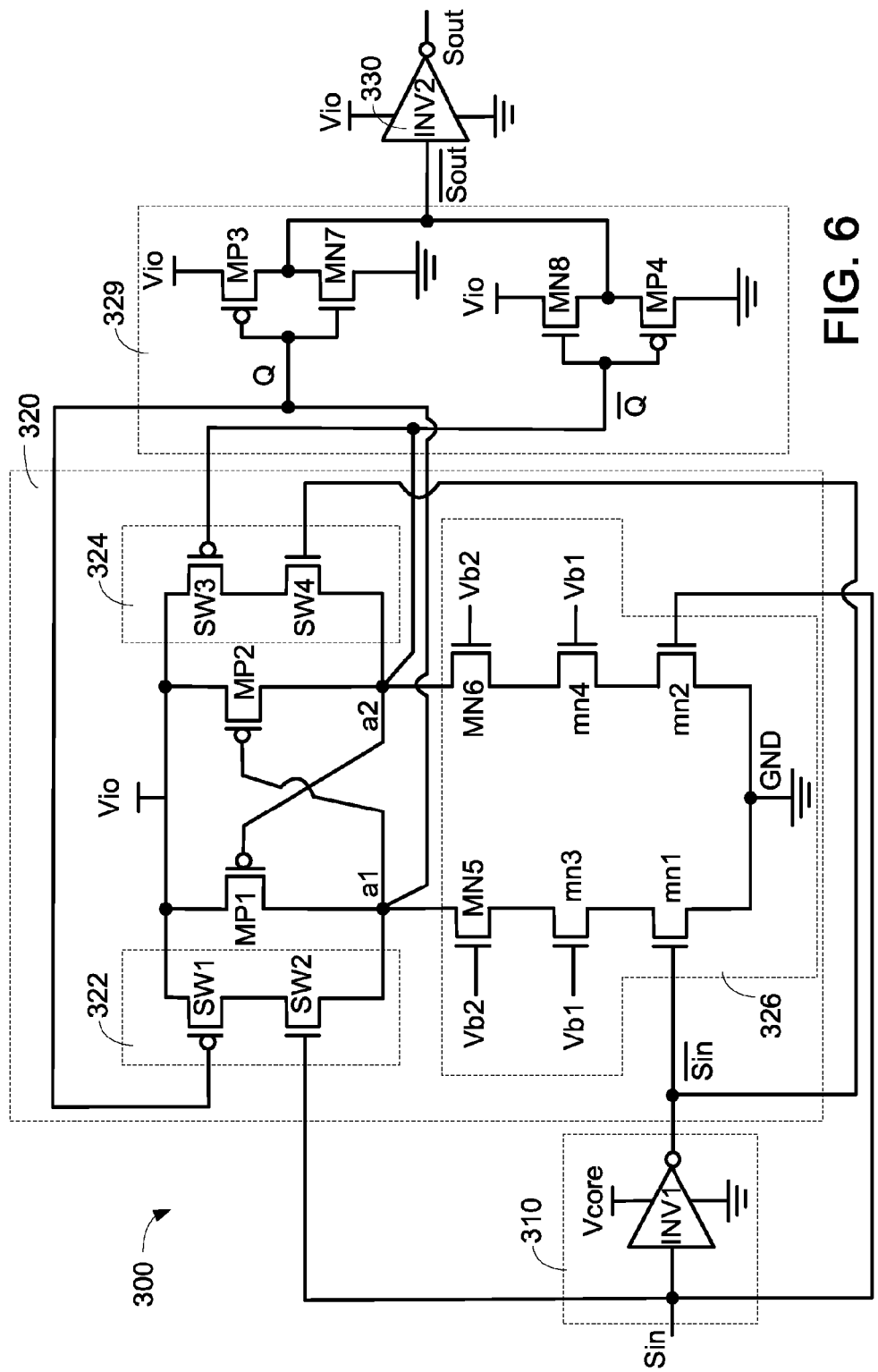
FIG. 6 is a schematic circuit diagram illustrating the detailed circuitry of a level shifter according to another embodiment of the present invention.

FIG. 6 is a schematic circuit diagram illustrating the detailed circuitry of a level shifter according to another embodiment of the present invention. As shown in FIG. 6, the level shifter 300 comprises an input side logic unit 310, a latching unit 320, a duty-cycle correction circuit 329, and an output side buffering unit 330. The configurations and functions of the input side logic unit 310, the latching unit 320 and the output side buffering unit 330 are similar to those of the first embodiment, and are not redundantly described herein.

The duty-cycle correction circuit 329 comprises a third P-type transistor MP3, a fourth P-type transistor MP4, a seventh N-type transistor MN7, and an eighth N-type transistor MN8. The gate terminal of the third P-type transistor MP3 and the gate terminal of the seventh N-type transistor MN7 are connected to the node a1 to receive a first signal Q. The source terminal of the third P-type transistor MP3 receives the input/output voltage Vio. The drain terminal of the third P-type transistor MP3 is connected to the drain terminal of the seventh N-type transistor MN7. The source terminal of the seventh N-type transistor MN7 is connected to the ground voltage. Moreover, the gate terminal of the fourth P-type transistor MP4 and the gate terminal of the eighth N-type transistor MN8 are connected to the node a2 to receive an inverted first signal $\overline{Q}$. The drain terminal of the eighth N-type transistor MN8 receives the input/output voltage Vio. The source terminal of the eighth N-type transistor MN8 is connected to the source terminal of the fourth P-type transistor MP4. The drain terminal of the fourth P-type transistor MP4 is connected to the ground terminal. Moreover, the control terminal of the third switch element SW3 receives the inverted first signal $\overline{Q}$, and the control terminal of the first switch element SW1 receives the first signal Q.

Obviously, when the state of the input signal Sin is changed, regardless of whether the first signal or the inverted first signal $\overline{Q}$ is firstly acted, the response of the duty-cycle correction circuit 329 is very fast to generate the inverted output signal $\overline{Sout}$. In response to the inverted output signal $\overline{Sout}$, the output side buffering unit 330 can change the output signal Sout in real time. That is, if the level switching action of the first signal is faster than that of the inverted first signal, the duty-cycle correction circuit 329 generates the inverted output signal $\overline{Sout}$ in response to the first signal. On the other hand, if the level switching action of the inverted first signal is faster than that of the first signal, the duty-cycle correction circuit 329 generates the inverted output signal $\overline{Sout}$ in response to the inverted first signal.

From the above description, the level shifter of the present invention is capable of converting a low input voltage into a wide-range high output voltage at a high speed by utilizing two switching units.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A level shifter, comprising:
   an input side logic unit for receiving an input signal and generating a complementary input signal pair, wherein the input signal and the complementary input signal pair are operated between a core voltage and a ground voltage;
   a latching unit comprising a first P-type transistor, a second P-type transistor, and a load unit, wherein the first P-type transistor has a source terminal receiving an input/output voltage, a drain terminal connected to a first node, and a gate terminal connected to a second node, wherein the second P-type transistor has a source terminal receiving the input/output voltage, a drain terminal connected to the second node, and a gate terminal connected to the first node, wherein the load unit is connected to the first node and the second node, and the first node and the second node generate a complementary output signal pair according to the complementary input signal pair; and
   an output side buffering unit connected to the second node for generating the complementary output signal pair, so that the complementary output signal pair is operated between the input/output voltage and the ground voltage,
   wherein the latching unit further comprises a first switching unit and a second switching unit, wherein the first switching unit comprises a first switch element and a second switch element, and the second switching unit comprises a third switch element and a fourth switch element, wherein the first switch element and the second switch element are serially connected between the input/output voltage and the first node, the first switch element has a control terminal receiving one signal of the complementary output signal pair, and the second switch element has a control terminal receiving one signal of the complementary input signal pair, wherein the third switch element and the fourth switch element are serially connected between the input/output voltage and the second node, the third switch element has a control terminal receiving the other signal of the complementary output signal pair, and the fourth switch element has a control terminal receiving the other signal of the complementary input signal pair.

2. The level shifter as claimed in claim 1, wherein the input side logic unit comprises a first inverter, wherein the first inverter has an input terminal receiving the input signal and an output terminal generating an inverted input signal, wherein the input signal and the inverted input signal constitute the complementary input signal pair.

3. The level shifter as claimed in claim 2, wherein the load unit comprises:
   a first N-type transistor having a source terminal connected to a ground terminal and a gate terminal receiving the inverted input signal;
   a second N-type transistor having a source terminal connected to the ground terminal and a gate terminal receiving the input signal;
   a third N-type transistor having a source terminal connected to a drain terminal of the first N-type transistor and a gate terminal receiving a first bias voltage;
   a fourth N-type transistor having a source terminal connected to a drain terminal of the second N-type transistor and a gate terminal receiving the first bias voltage;
   a fifth N-type transistor having a source terminal connected to a drain terminal of the third N-type transistor, a gate terminal receiving a second bias voltage, and a drain terminal connected to the first node; and
   a sixth N-type transistor having a source terminal connected to a drain terminal of the fourth N-type transistor, a gate terminal receiving the second bias voltage, and a drain terminal connected to the second node.

4. The level shifter as claimed in claim 3, wherein the first N-type transistor, the second N-type transistor, the third N-type transistor and the fourth N-type transistor are thin-oxide devices, and the fifth N-type transistor and the sixth N-type transistor are thick-oxide devices.

5. The level shifter as claimed in claim 3, wherein the first bias voltage is the core voltage, and the second bias voltage is the input/output voltage.

6. The level shifter as claimed in claim 2, wherein the load unit comprises:
   a first N-type transistor having a source terminal connected to a ground terminal, a gate terminal receiving the inverted input signal, and a drain terminal connected to the first node; and
   a second N-type transistor having a source terminal connected to the ground terminal, a gate terminal receiving the input signal, and a drain terminal connected to the second node.

7. The level shifter as claimed in claim 6, wherein the first N-type transistor and the second N-type transistor are thick-oxide devices.

8. The level shifter as claimed in claim 2, wherein the output side logic unit comprises a second inverter, wherein the second inverter has an input terminal receiving the inverted output signal and an output terminal generating the output signal, wherein the output signal and the inverted output signal constitute the complementary output signal pair.

9. The level shifter as claimed in claim 8, wherein the first switch element and the third switch element are P-type transistors, and the second switch element and the fourth switch element are N-type transistors, wherein the control terminal of the first switch element receives the output signal, the control terminal of the second switch element receives the input signal, the control terminal of the third switch element receives the inverted output signal, and the control terminal of the fourth switch element receives the inverted input signal.

10. The level shifter as claimed in claim 8, wherein the first switch element, the second switch element, the third switch element and the fourth switch element are all N-type transistors, wherein the control terminal of the first switch element receives the inverted output signal, the control terminal of the second switch element receives the input signal, the control terminal of the third switch element receives the output signal, and the control terminal of the fourth switch element receives the inverted input signal.

11. The level shifter as claimed in claim 8, wherein the first switch element, the second switch element, the third switch element and the fourth switch element are all P-type transistors, wherein the control terminal of the first switch element receives the output signal, the control terminal of the second switch element receives the inverted input signal, the control terminal of the third switch element receives the inverted output signal, and the control terminal of the fourth switch element receives the input signal.

12. The level shifter as claimed in claim 8, wherein the first switch element and the third switch element are N-type transistors, and the second switch element and the fourth switch element are P-type transistors, wherein the control terminal of the first switch element receives the inverted output signal, the control terminal of the second switch element receives the inverted input signal, the control terminal of the third switch element receives the output signal, and the control terminal of the fourth switch element receives the input signal.

13. A level shifter, comprising:
an input side logic unit for receiving an input signal and generating a complementary input signal pair, wherein the input signal and the complementary input signal pair are operated between a core voltage and a ground voltage;
a latching unit comprising a first P-type transistor, a second P-type transistor, and a load unit, wherein the first P-type transistor has a source terminal receiving an input/output voltage, a drain terminal connected to a first node, and a gate terminal connected to a second node, wherein the second P-type transistor has a source terminal receiving the input/output voltage, a drain terminal connected to the second node, and a gate terminal connected to the first node, wherein the load unit is connected to the first node and the second node, and the first node and the second node generate a first signal and an inverted first signal according to the complementary input signal pair;
a duty-cycle correction circuit connected to the first node and the second node, wherein if a level switching action of the first signal is faster than a level switching action of the inverted first signal, the duty-cycle correction circuit generates an inverted output signal in response to the first signal, wherein if the level switching action of the inverted first signal is faster than the level switching action of the first signal, the duty-cycle correction circuit generates the inverted output signal in response to the inverted first signal; and
an output side buffering unit for receiving the inverted output signal and generating a complementary output signal pair according to the inverted output signal, so that the complementary output signal pair is operated between the input/output voltage and the ground voltage,
wherein the latching unit further comprises a first switching unit and a second switching unit, wherein the first switching unit comprises a first switch element and a second switch element, and the second switching unit comprises a third switch element and a fourth switch element, wherein the first switch element and the second switch element are serially connected between the input/output voltage and the first node, the first switch element has a control terminal receiving the first signal, and the second switch element has a control terminal receiving one signal of the complementary input signal pair, wherein the third switch element and the fourth switch element are serially connected between the input/output voltage and the second node, the third switch element has a control terminal receiving the inverted first signal, and the fourth switch element has a control terminal receiving the other signal of the complementary input signal pair.

14. The level shifter as claimed in claim 13, wherein the input side logic unit comprises a first inverter, wherein the first inverter has an input terminal receiving the input signal and an output terminal generating an inverted input signal, wherein the input signal and the inverted input signal constitute the complementary input signal pair.

15. The level shifter as claimed in claim 14, wherein the load unit comprises:
a first N-type transistor having a source terminal connected to a ground terminal and a gate terminal receiving the inverted input signal;
a second N-type transistor having a source terminal connected to the ground terminal and a gate terminal receiving the input signal;
a third N-type transistor having a source terminal connected to a drain terminal of the first N-type transistor and a gate terminal receiving a first bias voltage;
a fourth N-type transistor having a source terminal connected to a drain terminal of the second N-type transistor and a gate terminal receiving the first bias voltage;
a fifth N-type transistor having a source terminal connected to a drain terminal of the third N-type transistor, a gate terminal receiving a second bias voltage, and a drain terminal connected to the first node; and
a sixth N-type transistor having a source terminal connected to a drain terminal of the fourth N-type transistor, a gate terminal receiving the second bias voltage, and a drain terminal connected to the second node.

16. The level shifter as claimed in claim 15, wherein the first N-type transistor, the second N-type transistor, the third N-type transistor and the fourth N-type transistor are thin-oxide devices, and the fifth N-type transistor and the sixth N-type transistor are thick-oxide devices.

17. The level shifter as claimed in claim 15, wherein the first bias voltage is the core voltage, and the second bias voltage is the input/output voltage.

18. The level shifter as claimed in claim 14, wherein the load unit comprises:
a first N-type transistor having a source terminal connected to a ground terminal, a gate terminal receiving the inverted input signal, and a drain terminal connected to the first node; and
a second N-type transistor having a source terminal connected to the ground terminal, a gate terminal receiving the input signal, and a drain terminal connected to the second node.

19. The level shifter as claimed in claim 18, wherein the first N-type transistor and the second N-type transistor are thick-oxide devices.

20. The level shifter as claimed in claim 14, wherein the first switch element and the third switch element are P-type transistors, and the second switch element and the fourth switch element are N-type transistors, wherein the control terminal of the first switch element receives the first signal, the control terminal of the second switch element receives the input signal, the control terminal of the third switch element receives the inverted first signal, and the control terminal of the fourth switch element receives the inverted input signal.

21. The level shifter as claimed in claim 14, wherein the first switch element, the second switch element, the third switch element and the fourth switch element are all N-type transistors, wherein the control terminal of the first switch element receives the inverted first signal, the control terminal of the second switch element receives the input signal, the control terminal of the third switch element receives the first signal, and the control terminal of the fourth switch element receives the inverted input signal.

22. The level shifter as claimed in claim 14, wherein the first switch element, the second switch element, the third switch element and the fourth switch element are all P-type transistors, wherein the control terminal of the first switch element receives the first signal, the control terminal of the second switch element receives the inverted input signal, the control terminal of the third switch element receives the inverted first signal, and the control terminal of the fourth switch element receives the input signal.

23. The level shifter as claimed in claim 14, wherein the first switch element and the third switch element are N-type transistors, and the second switch element and the fourth switch element are P-type transistors, wherein the control terminal of the first switch element receives the inverted first signal, the control terminal of the second switch element receives the inverted input signal, the control terminal of the third switch element receives the first signal, and the control terminal of the fourth switch element receives the input signal.

24. The level shifter as claimed in claim 13, wherein the duty-cycle correction circuit comprises:
- a third P-type transistor having a gate terminal connected to the first node and a source terminal connected to the input/output voltage;
- a seventh N-type transistor having a gate terminal connected to the first node, a source terminal connected to the ground voltage, and a drain terminal connected to a drain terminal of the third P-type transistor;
- a fourth P-type transistor having a gate terminal connected to the second node, and a drain terminal connected to the ground voltage; and
- an eighth N-type transistor having a gate terminal connected to the second node, a drain terminal connected to the input/output voltage, and a source terminal connected to a source terminal of the fourth P-type transistor.

\* \* \* \* \*